(12) United States Patent
Ichihara et al.

(10) Patent No.: US 7,579,095 B2
(45) Date of Patent: Aug. 25, 2009

(54) DIFFERENTIALLY ORIENTED PATTERNED MAGNETIC MEDIA

(75) Inventors: Shigeru Ichihara, Tokyo (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 11/740,539

(22) Filed: Apr. 26, 2007

(65) Prior Publication Data
US 2007/0259210 A1   Nov. 8, 2007

(30) Foreign Application Priority Data
May 2, 2006   (JP) .............................. 2006-128355

(51) Int. Cl.
*G11B 5/66*   (2006.01)
*G11B 5/65*   (2006.01)

(52) U.S. Cl. .................... 428/836; 428/827; 428/692.1; 428/829; 428/826; 428/822; 428/836.1; 428/836.2; 428/836.3

(58) Field of Classification Search ................ 428/826, 428/827, 836, 836.1–836.3
See application file for complete search history.

(56) References Cited

U.S. PATENT DOCUMENTS

| | | | |
|---|---|---|---|
| 5,738,927 A * | 4/1998 | Nakamura et al. ........... 428/141 |
| 5,851,643 A * | 12/1998 | Honda et al. ................. 428/212 |
| 6,602,620 B1 * | 8/2003 | Kikitsu et al. ............. 428/842.2 |
| 6,717,777 B2 | 4/2004 | Den et al. |
| 6,841,224 B2 * | 1/2005 | Kamata et al. ........... 428/836.3 |
| 6,852,431 B2 | 2/2005 | Fukutani et al. |
| 6,858,319 B2 | 2/2005 | Yasui et al. |
| 6,947,235 B2 * | 9/2005 | Albrecht et al. .............. 360/55 |
| 7,070,855 B2 | 7/2006 | Fukutani et al. |
| 2004/0258962 A1 * | 12/2004 | Nolan et al. ........... 428/694 BH |
| 2006/0022342 A1 | 2/2006 | Fukutani et al. |
| 2006/0194433 A1 | 8/2006 | Saito et al. |
| 2006/0204794 A1 * | 9/2006 | Kikuchi et al. ........... 428/836.2 |

FOREIGN PATENT DOCUMENTS

| | | | |
|---|---|---|---|
| JP | 2004-220671 A | | 8/2004 |
| JP | 2004220671 A | * | 8/2004 |
| JP | 2006-48864 A | | 2/2006 |

OTHER PUBLICATIONS

Yasui et al. Applied Physics Letters, vol. 83(16):3347-3349, 2003.*

(Continued)

*Primary Examiner*—David R Sample
*Assistant Examiner*—April C Inyard
(74) *Attorney, Agent, or Firm*—Fitzpatrick, Cella, Harper & Scinto

(57) ABSTRACT

A structure has a substrate and a layer containing a magnetic material dispersed in a nonmagnetic material, the magnetic material being comprised of first crystal particles having an easy magnetization axis crytsllographically oriented in the direction of the normal line of the substrate and forming columns perpendicular to the substrate and second crystal particles having a crystallographic orientation in a direction different from the direction of the crystallographic orientation in the first crystal particles, and the ratio of the second crystal particles to the entire crystal particles in the columns ranging from 10% to 50% by weight.

1 Claim, 3 Drawing Sheets

OTHER PUBLICATIONS

Kai-Zhong Gao et al., "Transition Jitter Estimates in Tilted and Conventional Perpendicular Recording Media at 1 Tb/in2", IEEE Transactions on Magnetics, vol. 39, No. 2, pp. 704-709, Mar. 2003.

Hideki Masuda et al., "Fabrication of Gold Nanodot Array Using Anodic Porous Alumina as an Evaporation Mask", Jpn. J. Appl. Phys. vol. 35, pp. 126-129 (1996).

* cited by examiner

DIFFERENTIALLY ORIENTED PATTERNED MAGNETIC MEDIA

BACKGROUND OF THE INVENTION

1. Field of the Invention

The present invention relates to a structure for high-density recording, and a process for producing the structure.

2. Description of the Related Art

Remarkable increase of the amount of information in recent years necessitates a higher recording density and a higher recording capacity for magnetic recording devices like a hard disk device (HDD). For the high recording density, magnetic particles contained in the recording layer should be micronized. However, the micronization of magnetic particles makes significant the thermal energy retained in the particle relative to the magnetic energy. This produces a superparamagnetic effect (thermal fluctuation) to cause dissipation of magnetic record disadvantageously. To stabilize the magnetic record against the thermal fluctuation, materials are being developed which have a higher magnetic anisotropy constant (Ku).

The magnetic recording medium containing a high-Ku material retains effectively the magnetization direction against an external magnetic field applied for recording. This lowers the sensitivity of the magnetic recording medium to an external magnetic field for the recording. In particular, a higher recording density and a higher data transfer rate demanded in recent years will limit the maximum intensity of the magnetic field generated by a recording head to make insufficient the recording capability. The recording magnetic field generated by a recording head depends on various factors including an electric current applied to the recording coil, a material and shape of the magnetic poles, a clearance between the head and the recording medium, and a soft magnetic underlayer (SUL). Therefore the intensity of the magnetic field in the recording head has an upper limit. The magnetic field generated by the recording head is expected to have an intensity of about 10 kOe at most. On the other hand, a recording medium which contains fine magnetic particles of about 5 nm and has a Ku of $10^7$ erg/cm$^3$ for resistance to thermal fluctuation, for example, is expected to require a magnetic field of 10 kOe or more for saturation of recording. Therefore, for further improvement of the recording density, not only the Ku as a recording medium characteristic but also the thermal fluctuation resistance should be improved.

A paper (IEEE. Transactions on Magnetics, 2003, vol. 39, no. 2, pp. 704-709) reports that the recording sensitivity can be improved by shifting the direction of the easy magnetization axis of the recording medium from the direction of the recording magnetic field of the head. Inclination of the easy magnetization axis direction of the recording medium by 45° from the magnetic field of the head recording enables decrease of the magnetic field intensity for magnetization reversal to a ½ level to increase the recording sensitivity while the thermal fluctuation resistance of the recording medium is retained.

Japanese Patent Application Laid-Open Nos. 2004-220671 and 2006-48864 disclose improvement of the recording sensitivity by controlling the easy magnetization axis direction. Specifically, Japanese Patent Application Laid-Open No. 2004-220671 discloses a recording medium having a constitution in which high-Ku nano-particles are dispersed in a low-melting matrix and the crystal axes of the nano-particles are inclined by 45° from the direction perpendicular to the recording medium face. Japanese Patent Application Laid-Open No. 2006-48864 discloses a discrete-track medium as a magnetic recording medium in which magnetic phase patterns partitioned by the grooves have respectively a taper inclined relative to the face perpendicular to the axis of crystal anisotropy of the magnetic phase.

On the other hand, for higher recording density of the magnetic recording medium, noises in record reproduction should be reduced beside the improvement in the thermal fluctuation resistance and in the recording sensitivity. For the noise reduction, exchange-coupling between the magnetic particles in the recording layer should be broken, and the magnetic particle size dispersion should be decreased to uniformize the magnetic cluster size. However, any of known techniques does not satisfy all of the above requirements.

The present invention intends to provide a structure for a recording medium or the like which comprises magnetic particles having controlled particle sizes and a high-Ku material having thermal fluctuation resistance. The present invention intends to provide also a process for producing the structure.

SUMMARY OF THE INVENTION

The present invention is directed to a structure having a substrate and a layer containing a magnetic material dispersed in a nonmagnetic material, the magnetic material being comprised of first crystal particles having an easy magnetization axis crystallographically oriented in the direction of the normal line of the substrate and forming columns perpendicular to the substrate and second crystal particles having a crystallographic orientation in a direction different from the direction of the crystallographic orientation in the first crystal particles, and the ratio of the second crystal particles to the entire crystal particles in the columns ranging from 10% to 50% by weight.

In the structure, a dispersion of volume ratios of the second crystal particle to the first crystal particle in the respective columns can be not more than 10%.

The crystallographic orientation of the first crystal particles can depend on a crystal arrangement of crystal particles which is comprised in an orientation-controlling layer provided under the first crystal particles.

The second crystal particle be able to have no axis of symmetry in the direction of the normal line of the substrate and can be placed eccentrically in the column.

The crystallographic orientation of the second crystal particles can depend on a crystal arrangement of crystal particles which is comprised in a second orientation-controlling layer provided in contact with the second crystal particles.

The area of the top face of the column of the magnetic material can be larger than the area of the bottom thereof relative to the substrate.

The magnetic material can be comprised of one or two compounds.

The present invention is directed to a process of a structure comprising a substrate, an orientation-controlling layer laminated on the substrate and a nonmagnetic matrix which includes magnetic bodies and is laminated on the orientation-controlling layer, which comprises the steps of: forming a nonmagnetic matrix having cylindrical pores perpendicular to the substrate, forming at bottoms and lower portions of the pores first crystal particles having an easy magnetization axis crystallographically oriented in the direction of the normal line of the substrate, and forming in the pores second crystal particles having a crystallographic orientation in a direction different from the direction of the crystallographic orientation in the first crystal particles.

The first crystal particles and the second crystal particles in the process can be formed by sputtering.

The present invention enables improvement of the recording sensitivity of the magnetic recording medium with the thermal fluctuation resistance maintained.

Further features of the present invention will become apparent from the following description of exemplary embodiments with reference to the attached drawings.

DESCRIPTION OF THE EMBODIMENTS

The present invention is described by reference to drawings.

(Structure of the Present Invention)

Figure 1:
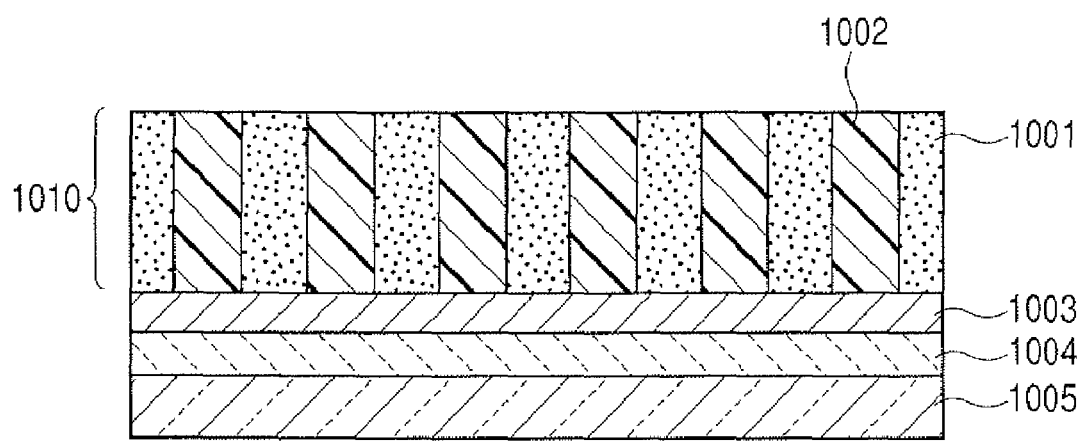
FIG. 1 is a sectional view of a structure of the present invention.
Figure 2:
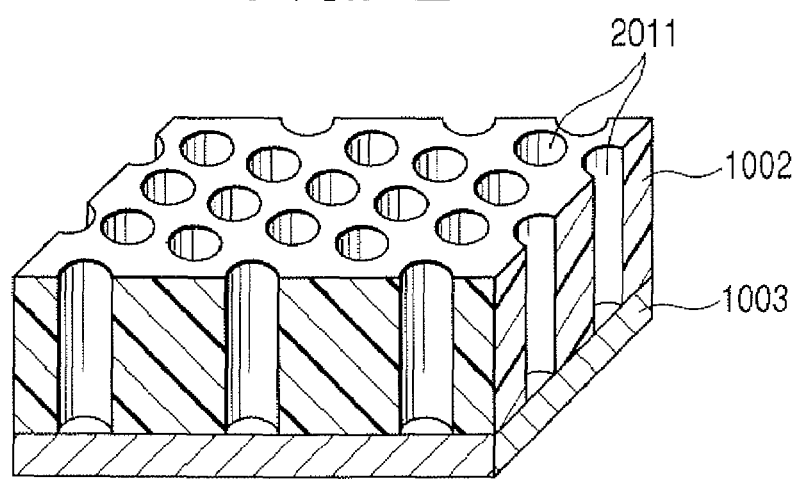
FIG. 2 is a schematic view of a nonmagnetic matrix.

FIG. 1 is a sectional view of a structure of the present invention. The structure of the present invention has substrate 1005, underlayer 1004 laminated on substrate 1005, orientation-controlling layer 1003 laminated on underlayer 1004, and magnetic recording layer 1010 formed on orientation-controlling layer 1003. Magnetic recording layer 1010 is constituted of many columnar magnetic bodies 1001 and nonmagnetic matrix 1002 surrounding the columnar magnetic bodies. As illustrated in FIG. 2, nonmagnetic matrix 1002 is formed on orientation-controlling layer 1003 and has many pores 2011. Pores 2011 penetrate the nonmagnetic matrix in the thickness direction of magnetic recording layer to reach orientation-controlling layer 1003. Magnetic bodies 1001 are in a shape of columns dispersed in the nonmagnetic material. The respective columnar magnetic bodies have preferably the top face larger in area than the bottom face.

Figure 3:
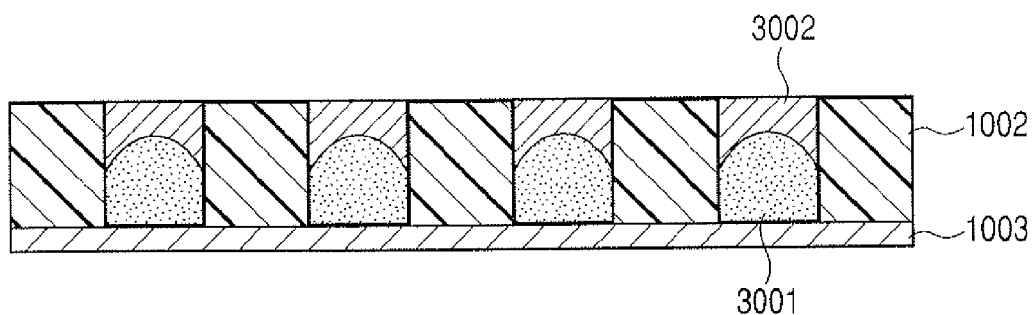
FIG. 3 is a sectional view illustrating constitution of first crystal particles and second crystal particles filled in pores of the nonmagnetic matrix of a structure of the present invention.

The material for constituting magnetic body 1001 is not limited provided that the material has a relatively high magnetic anisotropy constant (Ku). For example, the Ku of this material is preferably not lower than $1\times10^7$ erg/cm$^3$, more preferably not lower than $3\times10^7$ erg/cm$^3$. The material having a higher Ku has higher resistance to thermal fluctuation. The high-Ku material includes a FePt alloy and a CoPt alloy having an $L1_0$ structure, a Fe$_3$Pt alloy having an $L1_2$ structure, and a Co$_3$Pt alloy having an hcp structure. The magnetic body is constituted preferably of one or two kinds of compounds. FIG. 3 (sectional view) illustrates the columnar magnetic bodies. In FIG. 3, the one magnetic body is constituted of first crystal particle 3001 oriented to have its easy magnetization axis perpendicular to the substrate, and second crystal particle 3002 oriented to have its easy magnetization axis in a direction different from that of the first crystal particle. Therefore, the magnetic body does not have a symmetry axis in the direction normal to the substrate.

A crystal particle having its easy magnetization axis inclined by 45° from the head recording magnetic field in HDD, which is an external magnetic field direction normal to the substrate, can be reversely magnetized by ½ of the magnetic field for magnetization reversal of a crystal particle having its easy magnetization axis perpendicular to the substrate, whereby the recording sensitivity is improved. In the present invention, the second crystal particle has the easy magnetization axis direction shifted from the direction perpendicular to the substrate, so that the magnetization of the second crystal particle can be reversed more readily than that of the first crystal particle having the easy magnetization axis in the direction perpendicular to the substrate. Accordingly, the columnar magnetic body constituted of the first and second crystal particles can readily be reversed by a change of an external magnetic field in the direction perpendicular to the substrate in comparison with a columnar magnetic body constituted only of the first crystal particle, and giving a magnetic recording medium having a high recording sensitivity.

Next, the crystallographic orientation in the crystal particle constituting the magnetic body is described.

As illustrated in FIGS. 2 and 3, the structure of the present invention has first crystal particles 3001 and second crystal particles 3002 filled into fine pores 2011 (FIG. 2). The fine pores penetrate non-magnetic matrix 1002. At the bottoms of the fine pores, orientation-controlling layer 1003 is bared. In particular, when the magnetic bodies are made from $L1_0$-FePt, at least the surface of the orientation-controlling layer may be formed from a MgO (001) face to orient the crystal particles of magnetic bodies 1001 to a desired direction. Thereby, the orientation of the FePt crystal particles deposited on the bottoms of the fine pores is controlled to have the easy magnetization axis, namely the c-axis direction ([001] direction), of the FePt crystal particles to be perpendicular to the substrate. Thus, orientation of the crystal particles constituting the magnetic bodies laminated on the orientation-controlling layer depends on the orientation of the crystal particles constituting the orientation-controlling layer. To orient the c-axis direction perpendicular to the substrate, the orientation-controlling layer has preferably a tetragonal arrangement parallel to the substrate surface. In a preferred embodiment, a (001)-oriented MgO is employed as the orientation-controlling layer. In another embodiment, on an orientation-controlling layer like MgO-(001) face, a (001)-oriented Pt film is allowed to grow epitaxially. The orientation-controlling layer bared at the pore bottom is preferably formed from a material having an fcc structure and oriented in the direction of (111) or (001), more preferably in the direction of (001). Otherwise, c-axis-oriented ZnO is also useful.

Figure 5:
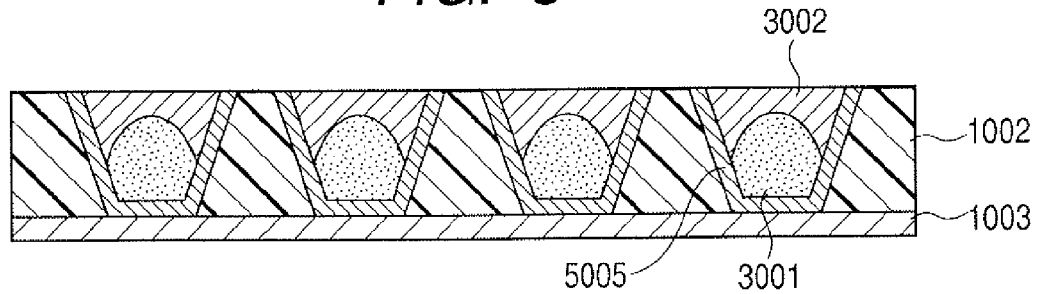
FIG. 5 is a sectional view illustrating constitution of first crystal particles and second crystal particles filled in pores of the nonmagnetic matrix of still another structure of the present invention.

The second crystal particles grow on the pore wall faces. An alumina nano-hole structure has a pore wall face of aluminum oxide, and an AlSi structure has a pore wall face of silicon oxide. When a thin film of $L1_0$-FePt is formed on the amorphous oxide by sputtering or a like process, the crystal face of the $L1_0$-FePt is not controlled to give a polycrystalline structure having various crystal faces. Similarly, in a fine pore having a relatively small diameter, a FePt crystal particle having a nucleus on the fine pore wall gives polycrystalline structure with somewhat arbitrary orientation owing to the small space in the pore. The second crystal particle may be controlled by the crystal arrangement of the particle constituting a second orientation-controlling layer similarly as the first crystal (FIG. 5). Thus the second crystal particles as well as the first crystal particles have respectively a certain orientation tendency, contributing to improvement of recording sensitivity when the structure of the present invention is used as a magnetic recording medium. The second crystal particles may be unevenly distributed in the fine pore of the porous material, whereby the second crystal particles grow larger to be oriented more uniformly.

In the present invention, essentially, the ratio of the second crystal particles to the first crystal particles should be limited in a certain range. The second crystal particle which has the easy magnetization axis inclined from the perpendicular direction can be magnetized reversely at a weaker switching magnetic field (i.e., the head magnetic field) perpendicular to the substrate in comparison with the first crystal particle which has the easy magnetization axis perpendicular to the substrate. Therefore, the recording sensitivity of the columnar magnetic bodies constituted of the first magnetic particles and the second magnetic particles depends on the ratio of the second crystal particles to the first crystal particles.

The recording sensitivity can be improved by increasing the ratio of the second crystal particles. In the structure of the present invention, the ratio of the second crystal particle to the entire crystal particles in the respective magnetic columnar bodies is in the range from 10% to 50% by weight. The reason for limiting the range of the ratio is discussed later.

In consideration of the volume ratio of the second crystal particle to the first crystal particle in the respective columnar bodies, the dispersion of the volume ratios (hereinafter referred to as "orientation dispersion" occasionally) is preferably not more than 10%. When the orientation dispersion is large, the degree of magnetization reversal by an external magnetic field varies among the columnar magnetic bodies. This large dispersion caused noises in record reproduction. The orientation dispersion among the respective columnar magnetic bodies is preferably not more than 10%, more preferably not more than 5%, still more preferably 0% if possible.

The ratio of the second crystal particle to the entire crystal particles in the respective columnar bodies is limited in the range from 10% to 50% as mentioned above to keep the orientation dispersion to be lower the 10%. At the ratio of the second crystal particle of higher than 50%, the orientation dispersion exceeds 10%, resulting in increase of the noise in record reproduction. On the other hand, at the ratio of the second crystal particles to the entire crystal particles of lower than 10%, the recording sensitivity is not higher than that of the recording medium containing the magnetic bodies having easy magnetization axes entirely perpendicular to the substrate. Therefore, the recording sensitivity can be increased by bringing the ratio of the second crystal particle to the entire crystal particles in the respective fine pores within the range from 10% to 50%.

In the structure of the present invention, the first crystal particles and the second crystal particles constituting the magnetic bodies are formed preferably from the same compounds for simplification of the process for production of the structure. However, the first crystal particles and the second crystal particles may be formed respectively from different compounds. In this case, the second crystal particles are formed preferably from a material magnetizable reversely at a weaker magnetic field, or a material having a lower Ku than the first crystal particle.

(Nonmagnetic Matrix)

The nonmagnetic matrix may be formed from any nonmagnetic material. The material includes Si, Ge, Si—Ge mixtures (hereinafter referred to as $Si_1Ge_{1-x}$ (0<x<1), occasionally). The material may be an aluminum alloy constituted of aluminum and a valve metal M (M being at least one of Ti, Zr, Hf, Nb, Ta, Mo, W, and Cr).

The material for the substrate includes glass, Al, and Si.

Figure 6:
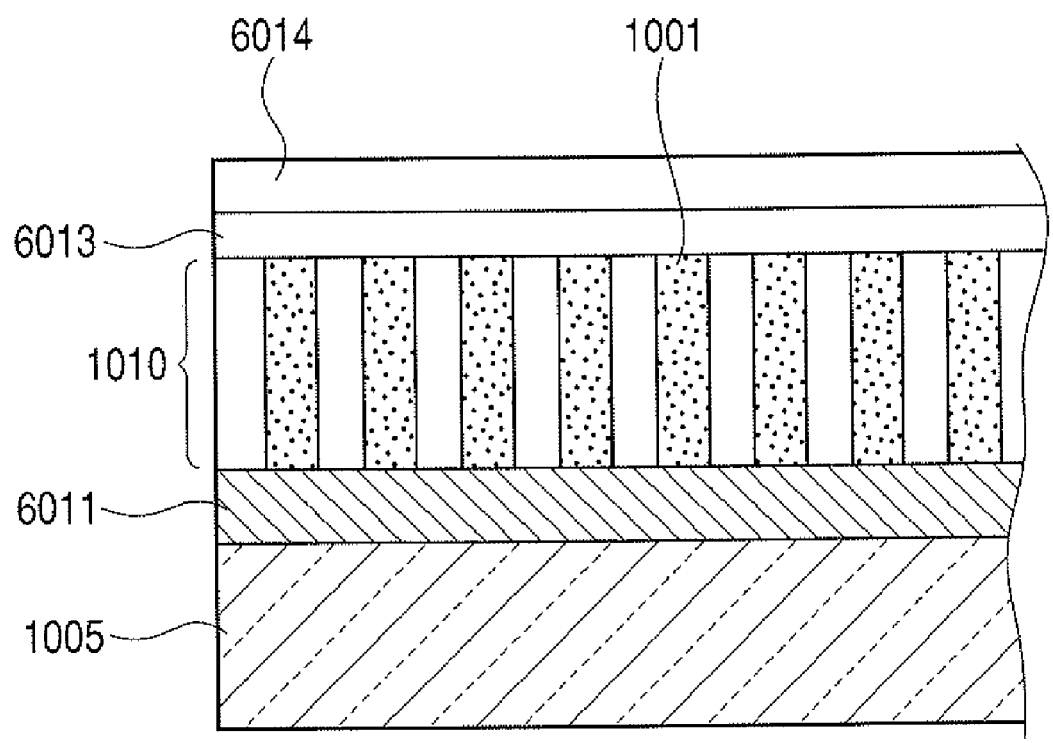
FIG. 6 is a schematic view of a magnetic recording medium.

The structure of the present invention is useful as a magnetic recording medium. FIG. 6 illustrates schematically a magnetic recording medium. This magnetic recording medium includes substrate 1005, underlying orientation-controlling layer 6011 formed on substrate 1005, and magnetic recording layer 1010 formed on underlying orientation-controlling layer 6011. The magnetic recording layer is constituted of magnetic bodies 1001 for magnetic recording and other portion for keeping the shape of the magnetic recording layer.

On the substrate, a NiP film may be formed by plating or a like process for securing the hardness of the magnetic recording medium. A soft-magnetic material may be formed effectively as SUL. The SUL may be constituted mainly of $Ni_tFe_{1-t}$ ($0.65 \leq t \leq 0.91$ preferably). The SUL may contain additionally Ag, Pd, Ir, Rh, Cu, Cr, P, B, and the like. Otherwise the SUL may be formed from an amorphous soft-magnetic material such as FeTaC, and CoZrNb. An additional film may be formed for controlling properties such as the particle size of the SUL.

The orientation-controlling layer may be formed from a component capable of controlling the crystallographic orientation in magnetic recording layer 1010.

The magnetic recording medium of the present invention may have a protection layer 6013 for abrasion resistance. Protection layer 6013 can be formed effectively from carbon or a high-hardness nonmagnetic material such as a carbide and a nitride for abrasion resistance against friction with the recording head.

Further, PFPE (perfluoropolyether) is preferably applied as a lubrication layer of the magnetic recording medium in the present invention. The magnetic recording medium of the present invention is useful as a medium for perpendicular magnetic recording.

(Process for Producing Structure of the Present Invention)

The structure of the present invention has a substrate, an orientation-controlling layer laminated on the substrate, and a nonmagnetic matrix containing magnetic bodies laminated on the orientation-controlling layer. The process comprises forming a nonmagnetic matrix having cylindrical pores perpendicular to the substrate, forming first crystal particles at bottoms and lower portions of the pores to be oriented to have an easy magnetization axis direction perpendicular to the substrate, and forming second crystal particles in the pores to be oriented in a direction different from the first crystal particle.

(Process for Formation of Nonmagnetic Matrix)

In the process for formation of the structure of the present invention, on a substrate, a nonmagnetic matrix is formed which has fine cylindrical through pores perpendicular to the substrate.

The method for formation of the nonmagnetic matrix is not limited provided that the above matrix construction can be formed. For example, U.S. Pat. Nos. 7,070,855; 6,858,319; and US-2006-0194433 disclose methods therefor. U.S. Pat. No. 7,070,855 discloses formation of a construction containing columnar members and a region surrounding the columnar members by use of a material capable of forming a phase-separated structure, and subsequent removal of the columnar member regions to prepare a porous layer. U.S. Pat. No. 6,858,319 discloses fine pore formation by anodization of aluminum or an aluminum-containing alloy in a solution of oxalic acid, phosphoric acid, or the like. US-2006-0194433 discloses anodization of an aluminum alloy containing aluminum and a valve metal M (M being at least one of Ti, Zr, Hf, Nb, Ta, Mo, W, and Cr) and pore-widening treatment. In production of the structure of the present invention, any of the above methods is applicable for formation of the nonmagnetic matrix. The methods for formation of the structure in the present invention are described below.

In a process for producing the nonmagnetic matrix of the structure of the present invention, a layer having columnar member regions and another region surrounding the columnar member regions may be formed from a material capable of forming a separated phase-containing layer, and the columnar member regions are removed. Specifically, a layer is formed by a non-equilibrated film forming process with a target containing a material constituting the columnar member regions and another material constituting a region surrounding the columnar member regions. Thereby columnar member regions and a region surrounding the columnar member regions are formed. Then the columnar member region is removed selectively. The method of the selective removal is decided depending on the material constituting the columnar member regions. For example, the columnar member region constituted of Al can be removed by immersion in 2.8% diluted aqueous ammonia. Thus the nonmagnetic matrix is formed. When $Si_1Ge_{1-x}$ (0<x<1) is used as the material for constituting the region surrounding the columnar member regions, the nonmagnetic matrix is composed of $Si_1Ge_{1-x}$ (0<x<1).

In another process of production of the structure in the present invention, the nonmagnetic matrix may be formed by anodization of aluminum or an aluminum-containing alloy in a solution of oxalic acid or phosphoric acid. By this process, a porous material having alumina, an oxide, on the pore walls (alumina nano-holes) is formed as the nonmagnetic matrix. This alumina nano-hole construction is characterized by a special geometrical structure in which extremely fine cylindrical pores of several to hundreds of nanometers in diameter are arranged parallel at intervals of tens to hundreds of nanometers. The cylindrical fine pores have high aspect ratios and have uniform sectional diameters (Japanese Journal of Applied Physics, 1996, vol. 35, pp. 126-129).

In the above process for formation of the nonmagnetic matrix, the fine pore dimension (depth, diameter, pore intervals, etc.) can be modified by changing the anodization conditions. For example, the depth of the fine pores can be increased by extending the anodization time. The pore diameter can be increased by a pore-widening treatment. The pore intervals can be modified by changing the voltage in the anodization. Incidentally, the pore-widening treatment is conducted by etching of the alumina, usually by wet etching in phosphoric acid. The interval between the fine pores can be changed by forming dents on the surface of the structure by use of a mold having protrusions and anodizing the structure (nanometric imprinting). With such an obtained nonmagnetic matrix, a magnetic recording medium (patterned medium) can be produced in which one fine pore corresponds to one bit.

Otherwise, the nonmagnetic matrix may be formed by anodization of an aluminum alloy constituted of aluminum and a valve metal M (M: at least one of Ti, Zr, Hf, Nb, Ta, Mo, W, and Cr) and pore-widening treatment thereof. This method enables modification of the diameter of the pores constituting the nonmagnetic matrix by utilizing the acid sensitivity of the valve metal. For example, aluminum alloys containing Mo, W, Cr, or the like have a high solubility to an acid, whereas the aluminum alloys containing Hf, Ti, Zr, or the like have a low solubility in an acid. Therefore, the anodized film can selectively removed by controlling the amount of the added valve metal, and treatment time. Otherwise, the top of the pore can be made larger than the bottom of the pore by providing multiple-layered film containing different valve metals or containing the metal in different concentration. With such a constitution of the pores, a second orientation-controlling layer can be formed readily on the pore wall.

In the structure of the present invention, the diameter of the fine pore of the nonmagnetic matrix ranges from 1 to 100 nm, preferably from 2 to 40 nm, more preferably from 4 to 20 nm. The depth of the fine pore corresponds to the film thickness of magnetic recording layer of the intended structure like a magnetic recording medium, an object of application of the present invention, and affects the record reproduction characteristics, the pore depth ranging from 4 to 50 nm, preferably from 4 to 30 nm, more preferably from 4 to 20 nm.

(Process for Formation of First Crystal Particles and Second Crystal Particles)

In the process for producing the structure in the present invention, after formation of the nonmagnetic matrix, crystal particles (first crystal particles) oriented in a certain direction are formed on the bottom portions of the fine pores of the nonmagnetic matrix. Thereafter, crystal particles (second crystal particles) are formed which are oriented in a direction different from the orientation direction of the first crystal particles. This process is described by reference to FIG. 3.

FIG. 3 is a sectional view illustrating an embodiment of the first crystal particles and the second crystal particles filled into the fine pores of the nonmagnetic matrix of the structure of the present invention. In FIG. 3, first crystal particles 3001 and second crystal particles 3002 are filled into the fine pores of nonmagnetic matrix 1002. The first crystal particles have the easy magnetization axes directed perpendicular to the substrate (not shown in the drawing). The second crystal particles have the easy magnetization axes oriented in a direction different from the orientation direction of the first crystal particles. The first crystal particles and the second crystal particles constitute the columnar magnetic bodies of the structure of the present invention. The materials for the first crystal particles and the second crystal particles are mentioned above.

The magnetic body constituted of the first crystal particles and the second crystal particles can be filled into the pores by a dry process such as sputtering, CVD, and vapor deposition. The filling can also be conducted by film formation with ionized metal particles generated by an arc plasma gun, or a like method. The process conditions should be set for the formation process. The control of the ratio of the volumes of the first crystal particles to the volume of the second crystal particles is important. Further for controlling the crystal particles, the aspect ratio of the fine pores is also an important control factor. For example, in filling of the magnetic bodies in fine pores of a diameter of not more than 50 nm having an aspect ratio of higher than 5, a deposit formed on the upper portion of the porous member prevents the filling into the fine pores depending on the dry process conditions. Into such fine pores, the magnetic bodies cannot be filled completely. Therefore, the fine pores having diameters of not more than 50 nm should have the aspect ratio of preferably not higher than 2, more preferably not higher than 1. For example, in consideration of production of a patterned medium as a next-generation magnetic recording medium, in particular a medium of a high recording density of 1 tera-bits per square inch (1 Tbpsi), the intervals between the fine pores are expected to be about 25 nm or less, and the fine pore diameters are expected to be in the range from 15 to 20 nm. The thickness of the recording medium can be about 20 nm to have the aspect ratio of the pores of about 1, depending on the intended record reproduction characteristics.

A process for filling two kinds of crystal particles having easy magnetization axes in different directions into the pores is described, taking $L1_0$-FePt of high Ku as an example of the hard magnetic material. Other high-Ku magnetic materials than $L1_0$-FePt can be filled into the pores in a similar manner.

In the case where the hard magnetic material is filled into the pores by sputtering, the aspect ratio of the fine pores is important as mentioned above, and further the sputtering conditions should be optimized. For instance, a plate-shaped fine-porous filter is placed between the substrate and the target to utilize sputtered particles projected at a certain projection angle selectively, or a bias voltage is applied to the substrate.

To increase the ratio of a perpendicular component of the projected particles, the plate-shaped filter may be placed parallel to the substrate. The target and the substrate may be placed to be horizontal, like in a usual magnetron sputtering apparatus, in the present invention. For selecting particles projected in an intended direction, the substrate or the plate-shaped filter is inclined relative to the normal line of the substrate.

The above-mentioned bias voltage applied to the substrate attracts $Ar^+$ ions as well as the sputtered particles, whereby the $Ar^+$ ions etch the deposited particles formed by the sputtering. In particular, on the pore wall faces. Since the incident angles of the $Ar^+$ ions are large, the etching effect is high to allow the magnetic particles to deposit more selectively onto the bottom of the fine pores.

The control of the aspect ratio of the fine pores of the porous structure and of the film formation conditions enables control of the volume ratio of the second crystal particles to the first crystal particles.

After the two kinds of crystal particles (first crystal particle and second crystal particles) are filled into the fine pores, the superfluous magnetic material having been deposited on the top face of the porous member may be removed by polishing, etching or a like method.

EXAMPLE

The present invention is described more specifically with specific examples.

Example 1

A porous member having pores of 20 nm diameter at pore intervals of 30 nm and an aspect ratio of 1 is prepared as described below.

A (001)-oriented MgO layer (20 nm thick) is prepared on a substrate. On this MgO layer, a thin Pt film of 10 nm thick is formed by magnetron sputtering. On this thin Pt film, a Ti film of 1 nm thick is formed. This Ti film serves to prevent exfoliation of the film in the later anodization process. Thereon a AlZr alloy film of 20 nm thick, and a AlW film of 80 nm thick are formed successively. The Zr content in the AlZr alloy film, and the W content in the AlW alloy film are preliminarily determined of separate single films by fluorescence X-ray analysis (XRF), and are found to be 10 atom % and 10 atom % respectively. The prepared film is anodized in an aqueous 1 mol/L sulfuric acid at a bath temperature of 3° C. by application of a voltage of 12 V. After the anodization, a pore-widening treatment is conducted by immersion in an aqueous 2-wt % phosphoric acid solution at room temperature for 20 minutes. In the pore-widening treatment, the AlW alloy film is completely dissolved and fine pores are formed in the AlZr portion to obtain a porous member as illustrated in FIG. 2. The examination by scanning electron microscopy (SEM) shows that an alumina nano-hole structure has been obtained which has fine pores of a diameter of about 20 nm and an aspect ratio of 1.

FePt is filled into the fine pores by sputtering. The FePt, in ordinary film formation, is in a state of an irregular alloy having an fcc construction. However, the FePt is obtained in a state of an regular alloy of $L-1_0$ construction by film formation on a substrate at a high temperature, or by heat treatment after the film formation. The heat treatment temperature may be within the range in known processes which comprise addition of a third element such as Cu, Ag, and Au; introduction of distortion effect; sputtering at a high Ar gas pressure; and He ion irradiation. The temperature ranges, for instance, from 300° C. to 500° C.

In this Example, RF magnetron sputtering is conducted at a base pressure of $5 \times 10^{-5}$ Pa and an Ar gas pressure of $5 \times 10^{-1}$ Pa with a target of Fe50Pt50 at a substrate temperature of 350° C. Under such conditions, a regular alloy of $L1_0$ construction is formed by counter diffusion of Fe and Pt of the sputtered particles. In this sputtering, a plate-shaped filter is employed, and the bias applied to the substrate is controlled to prepare a magnetic bodies by controlling the state of the first crystal particles and the second crystal particles.

In the first sputtering, a filter is placed parallel to the substrate. Thereby the holes of the filter are directed to be perpendicular to the substrate to introduce selectively the sputtered particles into the fine pores in the direction perpendicular to the substrate. In this deposition, a bias voltage of −40 V is applied to the substrate. Thereby, the first crystal particles are selectively deposited on the bottom portions of the fine pores as illustrated in FIG. 3. The first crystal particles are deposited to a thickness of 10 nm from the bottom of the fine pores. In this first sputtering, deposition on the pore walls cannot be prevented completely, and sputtered particles deposit also on the top face of the porous member. Next, in the second sputtering, the second crystal particles are deposited without the filter by application of a bias voltage of −10 V. In the second sputtering, the FePt particles deposited on the pore walls have larger particle diameters.

After the sputtering deposition, the superfluous FePt on the top face of the porous member is removed by polishing or dry etching.

After the sputtering deposition, the sectional construction is examined by transmission electron microscopy (TEM). The pores are found to be filled with the first crystal particles and the second crystal particles as illustrated in FIG. 3: the first crystal particles being constituted of (001)-oriented $L1_0$-FePt having the c-axis perpendicular to the substrate by reflecting the orientation of the underlying layer, and the second crystal particles being constituted of $L1_0$-FePt orienting in various directions. The ratio of the second crystal particles is 38 wt % based on the entire columnar FePt.

The dispersion of the volume ratios of the second crystal particles to the first crystal particles in the columnar $L1_0$-FePt construction is estimated to be 8% (50 columns are taken for the estimation). The sample in this Example 1 is hereinafter referred to as Sample 1.

Example 2

A porous member similar to the one of Example 1 is prepared.

The sputtering is conducted nearly in the same manner as in Example 1, except that the plate-shaped filter and the substrate bias conditions are changed as below in order to control formation of the first crystal particles and the second crystal particles.

Figure 4:
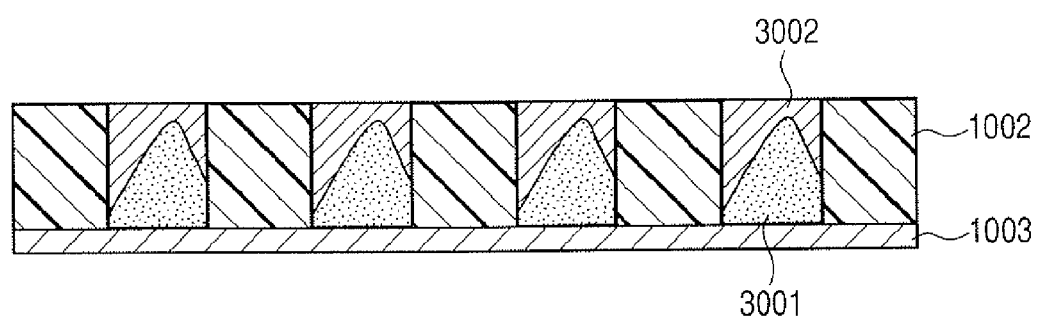
FIG. 4 is a sectional view illustrating constitution of the first crystal particles and the second crystal particles filled in pores of the nonmagnetic matrix of another structure of the present invention.

In the first sputtering, the filter is inclined by an angle of 5° relative to the substrate. Thereby, the holes through the filter are also inclined by 5° relative to the substrate to change slightly the projection direction of the sputtered particles from the direction perpendicular to the substrate. In this first sputtering, the bias voltage of −40 V is applied to the substrate. Crystal particles 3001 are formed eccentrically to be shifted from the center axes of the pores perpendicular to the substrate as illustrated in FIG. 4. The first crystal particles are formed to a height of 10 nm from the bottom face of the pores. In the subsequent second sputtering, second crystal particles 3002 are formed without the filter at the substrate bias voltage of −10 V. In the second sputtering, the FePt particles depositing on the pore wall faces have an increased diameter.

After the sputtering deposition, superfluous FePt having deposited on the top of the porous member is removed by polishing or dry etching.

After the sputtering deposition, the sectional construction is examined by transmission electron microscopy (TEM). The pores are found to be filled with first crystal particles 3001 and second crystal particles 3002 as illustrated in FIG. 4: the first crystal particles being constituted of (001)-oriented $L1_0$-FePt having the c-axis perpendicular to the substrate by reflecting the orientation of the underlying layer, and the second crystal particles being constituted of $L1_0$-FePt orienting in various directions. First crystal particles 3001 and second crystal particles 3002 are found to be displaced from the gravity centers perpendicular to the substrate of the respective columns as illustrated in FIG. 4. The ratio of the second crystal particles is 40% by weight based on the total columnar FePt. Since the growth of the second crystals is prevented less by the first crystal particles, the second crystals in this Example tend to have crystal particle sizes larger than that in Example 1.

The dispersion of the volume ratios of the second crystal particles to the first crystal particles in the columnar $L1_0$-FePt bodies is estimated to be 5% (50 columns are taken for the estimation). The sample in this Example 2 is hereinafter referred to as Sample 2.

Example 3

In this example, an orientation-controlling layer is provided on the respective pore walls.

A porous member is provided, as illustrated in FIG. 5, in which the pores are arranged at intervals of 30 nm, the pore diameter at the pore top is 28 nm, and the pore diameter at the bottom is smaller than at the pore top, and the aspect ratio of the pore is 1.

A Si substrate is employed. A (001)-oriented MgO layer (20 nm thick) is prepared on the Si substrate. On this MgO layer, a thin Pt film of 10 nm thick is formed by magnetron sputtering. On the thin Pt film, a Ti film of 1 nm thick is formed. Thereon a AlZr alloy film of 20 nm thick is formed in which the amount of the added Zr is reduced gradually from the substrate side toward the surface, and a AlW film of 80 nm thick are formed further thereon. The Zr content in the AlZr alloy and the W content in the AlW alloy are preliminarily determined of separate films by fluorescence X-ray analysis (XRF), the content being 10 atom % and 10 atom % respectively. Since the concentration of Zr in the AlZr alloy film is changed with the depth, the change of the concentration in the AlZr alloy film is confirmed by an energy dispersion type X-ray analyzer (EDS). The prepared film is anodized in an aqueous 1 mol/L sulfuric acid at a bath temperature of 3° C. by application of 12 V. After the anodization, a pore-widening treatment is conducted by immersion in an aqueous 2-wt % phosphoric acid solution at room temperature for 18 minutes. In the pore-widening treatment, the AlW alloy film is completely dissolved and fine pores are formed in the AlZr portion to obtain a porous member having pores in the AlZr portion with the pore diameter varying with the depth. The examination by scanning electron microscopy (SEM) shows that an alumina nano-hole structure has been obtained which has fine pores of a diameter of 28 nm at the surface portion of the porous member, and a diameter of 20 nm at the pore bottom face, a film thickness of 20 nm.

Next, MgO 5005 is formed by vapor deposition on the wall faces of the pores. The MgO deposits also on the bottom portion of the pores. The MgO is (001)-oriented in the direction parallel to the deposition surface.

The sputtering conditions are nearly the same as in Example 1.

In the first sputtering, the filter is placed parallel to the substrate. Thereby the holes of the filter are directed to be perpendicular to the substrate to introduce selectively the sputtered particles into the fine pores in the direction perpendicular to the substrate. In this deposition, bias voltage of −40 V is applied to the substrate. Thereby, as illustrated in FIG. 5, first crystal particles 3001 selectively deposit on the bottom portions of the fine pores. The first crystal particles are allowed to deposit to a height of 10 nm from the bottoms of the fine pores. Since the pore walls are inclined from the direction perpendicular to the substrate, the amount of the FePt particles deposited on the pore walls in the first sputtering is larger than that in Example 1 owing to the projection angles of the $Ar^+$ ions and sputtered particles. In this first sputtering, sputtered particles are deposited also on the top face of the porous member. Next, in the second sputtering, second crystal particles 3002 are allowed to deposit without the filter by application of a bias voltage of −10 V to the substrate. In this second sputtering, the amount of the FePt particles deposited on the pore walls is larger.

After the sputtering deposition, the superfluous FePt on the top face of the porous member is removed by polishing or dry etching.

After the sputtering deposition, the sectional construction is examined by transmission electron microscopy (TEM). From the TEM image, the pores are found to be filled with the first crystal particles and the second crystal particles: the first crystal particles being constituted of (001)-oriented $L1_0$-FePt having the c-axis perpendicular to the substrate by reflecting the orientation of the underlying layer, and the second crystal particles being constituted of $L1_0$-FePt having a crystallographic orientation controlled by the MgO (001) face on the side walls of the pores. The ratio of the second crystal particles is 45% based on the entire columnar FePt.

The volume ratios of the second crystal particles to the first crystal particles in the $L1_0$-FePt columns are examined. The dispersion of the volume ratios is estimated to be 6% (50 columns are taken for the estimation).

The sample prepared in this Example 3 is hereinafter referred to as Sample 3.

Example 4

A porous member is prepared nearly in the same manner as in Example 1 except that the time of the first sputtering is lengthened and the time of the second sputtering is shortened. After the sputtering deposition, the sectional construction is examined by transmission electron microscopy (TEM). The pores are found to be filled with the first crystal particles and the second crystal particles: the first crystal particles being constituted of (001)-oriented $L1_0$-FePt having the c-axis perpendicular to the substrate by reflecting the orientation of the underlying layer, and the second crystal particles being constituted of $L1_0$-FePt orienting in various directions. The ratio of the second crystal particles is 15% based on the entire columnar FePt.

The sample prepared in this Example is hereinafter referred to as Sample 4.

Comparative Example 1

A porous member is prepared nearly in the same manner as in Example 1 except that the time of the first sputtering is shortened and the time of the second sputtering is lengthened. After the sputtering deposition, the sectional construction is examined by transmission electron microscopy (TEM). The pores are found to be filled with the first crystal particles and the second crystal particles: the first crystal particles being constituted of (001)-oriented $L1_0$-FePt having the c-axis perpendicular to the substrate by reflecting the orientation of the underlying layer, and the second crystal particles being constituted of $L1_0$-FePt orienting in various directions. The ratio of the second crystal particles is 55% based on the entire columnar FePt.

The volume ratios of the second crystal particles to the first crystal particles in the $L1_0$-FePt columns are examined. The dispersion of the volume ratios is estimated to be 14% (50 columns are taken for the estimation).

The sample prepared in this Comparative Example 1 is hereinafter referred to as Sample 5.

Comparative Example 2

A porous member is prepared nearly in the same manner as in Example 1 except that the time of the first sputtering is extended further and the time of the second sputtering is shortened further in comparison with Example 4. After the sputtering deposition, the sectional construction is examined by transmission electron microscopy (TEM). The pores are found to be filled with the first crystal particles and the second crystal particles: the first crystal particles being constituted of (001)-oriented $L1_0$-FePt having the c-axis perpendicular to the substrate by reflecting the orientation of the underlying layer, and the second crystal particles being constituted of $L1_0$-FePt orienting in various directions. The ratio of the second crystal particles is 8% based on the entire columnar FePt.

The sample prepared in this Comparative Example is hereinafter referred to as Sample 6.

Example 5

A porous member is prepared nearly in the same manner as in Example 1 except that FePd is used as the sputtering material in the second sputtering.

After the sputtering deposition, the sectional construction is examined by transmission electron microscopy (TEM). The pores are found to be filled with the first crystal particles and the second crystal particles, as illustrated in FIG. 3: the first crystal particles being constituted of (001)-oriented $L1_0$-FePt having the c-axis perpendicular to the substrate by reflecting the orientation of the underlying layer, and the second crystal particles being constituted of $L1_0$-FePd having nonuniform crystallographic orientation. The ratio of the second crystal particles is 38% based on the entire of the FePt and FePd contained in the columns.

The volume ratios of the second crystal particles to the first crystal particles in the columns are examined. The dispersion of the volume ratios is estimated to be 8% (50 columns are taken for the estimation).

The sample prepared in this Example 5 is hereinafter referred to as Sample 7.

Example 6

Magnetic recording mediums are prepared which have respectively a glass substrate, a backing soft-magnetic layer, a recording layer, a protection layer, and a lubricating layer as illustrated in FIG. 6. One of the porous members of the above Samples 1 to 6 is employed as the recording layer in the respective magnetic recording mediums.

The state of recording on the recording mediums is evaluated as below. The recording medium is demagnetized by AC application, and contact recording is conducted with a magnetic head. In the measurement, recording is conducted by increasing the writing current to change the magnetic field of the head for recording, and the readout signals are detected. After confirmation of the readout signals, the state of the writing is evaluated by magnetic force scanning microscopy (MFM).

The signal strength is observed to be increased with increase of the magnetic field intensity of the recording head. Strength of recording magnetic field for writing signals in each of the following samples is in the order Sample 6>Sample 4>Sample 2>Sample 1 ≈Sample 7>Sample 3>Sample 5. Sample 5 can be easily written at relative low recording magnetic field. It is confirmed that the recording sensitivity can be heightened with increase of the ratio of the second crystal particle based on the entire crystal particles in the columns. Sample 5 gives low signal strength in comparison with Sample 3, and causes many noises, also in MFM images, which are considered to result from the column construction not magnetically reversible. Sample 5 is considered to give high medium noises owing to high volume-ratio dispersion of 14% of the second crystal particles to the first crystal particles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-128355, filed May 2, 2006 which is hereby incorporated by reference herein in its entirety.

What is claimed is:

1. A structure comprising:
   a substrate;
   a layer of a nonmagnetic material on the substrate, the layer having trapezoidal pores in its thickness direction, which are tapered toward the substrate; and
   a magnetic material in the pores,
   wherein the magnetic material comprises:
      first crystal particles having an easy magnetization axis crystallographically oriented in a direction normal to the substrate; and
      second crystal particles deposited on the first crystal particles, the second crystal particles having an easy magnetization axis crystallographically oriented in a direction different from the direction of the crystallographic orientation in the first crystal particles, and
   wherein the first crystal particles are deposited with a convex surface at an interface with the second crystal particles.

* * * * *